United States Patent [19]
Peck et al.

[11] Patent Number: 5,334,937
[45] Date of Patent: Aug. 2, 1994

[54] MAGNETIC FIELD GRADIENT COIL AND ASSEMBLY

[76] Inventors: Timothy L. Peck, 402 Sunrise Dr., Urbana, Ill. 61801; Pratik Ghosh, 1755 Paloma St., Pasadena, Calif. 91104

[21] Appl. No.: 966,885

[22] Filed: Oct. 27, 1992

[51] Int. Cl.$^5$ ............................................. G01V 3/00
[52] U.S. Cl. .................................... 324/318; 324/322
[58] Field of Search ............... 324/318, 322, 300, 307, 324/309; 128/653.5; 29/605, 825

[56] References Cited

U.S. PATENT DOCUMENTS

| | | | |
|---|---|---|---|
| 3,905,096 | 9/1975 | Tawara et al. | 29/605 |
| 4,461,076 | 7/1984 | Plummer, III | 29/825 |
| 4,847,985 | 7/1989 | Aubert | 29/605 |
| 4,910,462 | 3/1990 | Roemer et al. | 324/318 |
| 5,088,185 | 2/1992 | Siebold et al. | 29/605 |

*Primary Examiner*—Louis Arana
*Attorney, Agent, or Firm*—Banner, Birch, McKie & Beckett

[57] ABSTRACT

The present invention is a magnetic field gradient coil, assembly and system for use in imaging techniques requiring a magnetic field gradient. The magnetic field gradient coil includes a plurality of conductors wherein each conductor is arranged in a substantially spatially parallel relationship with respect to the other conductors for generating a magnetic field gradient. The plurality of substantially spatially parallel conductors may be integrated in a flexible structure. The flexible structure may be ribbon cable. The magnetic field gradient coil may further include a plurality of layers of the substantially spatially parallel conductors wherein each layer substantially overlies the preceding layer. A selected number of the substantially spatially parallel conductors may be electrically connected in parallel thereby providing a desired switching speed, or a desired field gradient strength, or a desired match of the output impedance of an electrical power source. Gradient coils designed and fabricated according to the present invention provide the advantages of ease of construction, improved winding uniformity, and better uniformity of the magnetic field gradient.

21 Claims, 4 Drawing Sheets

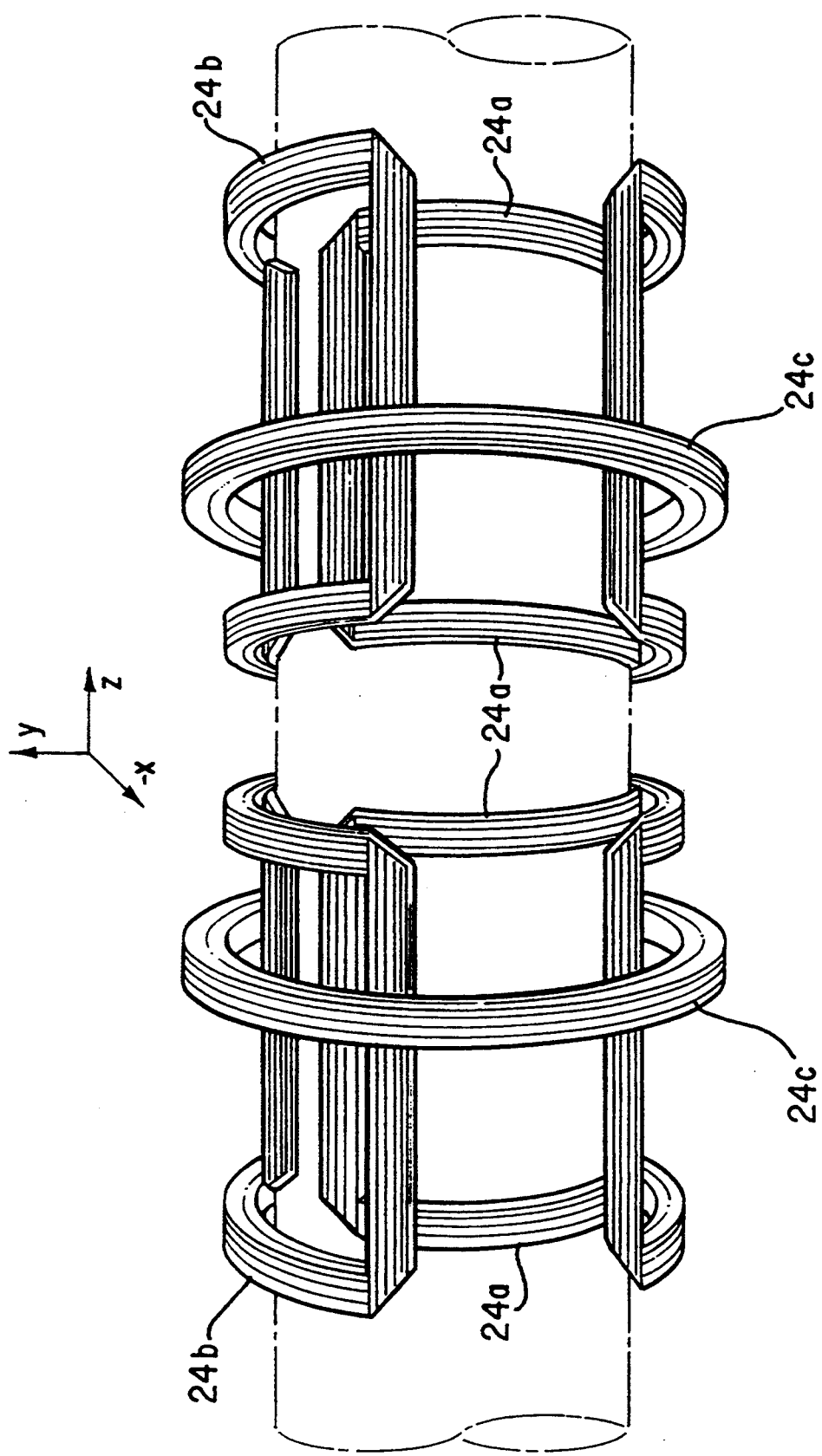

MAGNETIC FIELD GRADIENT COIL AND ASSEMBLY

BACKGROUND OF THE INVENTION

The present invention relates to imaging techniques which require magnetic field gradients, for example, nuclear magnetic resonance imaging and electron spin resonance imaging, and more particularly to the design, manufacture and fabrication of magnetic field gradient coils and assemblies.

Conventional techniques for fabricating, manufacturing and designing gradient coils have employed a single conductor as the basic "building block". The single conductor is wound continuously until desired characteristics have been attained for a given gradient coil, assembly and/or section. The gradient coils designed and fabricated using a single conductor approach tend to exhibit undesirable electrical characteristics including large impedances which result in relatively slow switching speeds. For example, the switching time is often a primary limitation to the speed of the nuclear magnetic resonance imaging applications.

The construction of gradient coils employing the single conductor construction is both tedious and time consuming due, in part, to the nature of the precision winding process. Manual construction of conventional gradient coils may require numerous hours to fully complete. Generally, great care must be taken to maintain the winding uniformity when wrapping the wire onto a coil former. Conventional gradient coils employ larger or higher gauge conductors (often copper wires) having small diameters. Larger diameters (smaller gauge) are much less pliable than are wires with smaller diameters. It is much more difficult to maintain winding uniformity when using larger diameter wires.

The winding uniformity is more easily maintained when wrapping circular coils (e.g., Maxwell coils) than when wrapping non-circular coils (e.g., saddle coils and quadrupolar coils). Circular coils are wound in a single plane, whereas saddle coils and quadrupolar coils are wound to conform to non-planar geometries.

Different approaches to an "optimal" design of magnetic field gradient coils have been described in the literature including earlier work by Golay, "Homogenizing Coils for NMR Apparatus," U.S. Pat. No. 3,622,869 as well as work by Schenck et al., "Transverse Gradient Field Coils for Nuclear Magnetic Resonance Imaging," U.S. Pat. No. 4,646,024; Wong et al., "Coil Optimization for MRI by Conjugate Gradient Descent," *Magn. Reson. Med.* 21 (1991) 39; Romeo et al., "Magnet Field Profiling: Analysis and Correcting Coil Design," *Magn. Reson. Med.* 1 (1984) 44; and Turner, "A Target Field Approach to Optimal Coil Design", *J Phys. D: Appl. Phys.* 19 (1986) L147; "Minimum Inductance Coils", *J Phys. E: Sci. Instrum.* 21 (1988) 952.

Bowtell et al. in, "Screened Coil Designs for NMR Imaging in Magnets with Transverse Field Geometry", *Meas. Sci. Technol.* 1 (1990) 431, describes a gradient coil design and fabrication technique involving etching of current patterns in copper sheets. The copper sheets are wrapped around a cylindrical former, resulting in a completed gradient coil assembly. While this technique is not limited to single layer structures, multi-layer designs require alignment and interconnection. These techniques require elaborate and expensive electronic equipment and facilities which tends to be cost-prohibitive for many groups working in the field.

Basically, the difficulties in constructing gradient coils and in achieving short switching times with gradient coils are somewhat inter-related. The difficulty in construction quickly leads a gradient coil designer to use small, flexible wires (often 18 gauge or smaller) which will bend more easily and conform more readily to a desired shape. The use of small wires, however, establishes a limit to the maximum current that may be safely applied to the gradient coil. As a result, to achieve a desired field gradient strength with such small diameter wires, a larger number of turns is necessary to achieve the desired value of magnetic field gradient. The larger number of turns yields a larger value of gradient coil impedance which results in a slower switching speeds of the coil.

As a result, there exists a need for an alternative approach to the design and construction of customized magnetic field gradient coils for nuclear magnetic resonance imaging. There exists a need for an inexpensive gradient coil which is easy to fabricate from inexpensive commercially available and commercially abundant materials. There exists a need for a gradient coil having a small impedance providing fast switching speeds which may be remotely and electronically switchable into various modes of operation providing desired electrical characteristics such as rapid rise times with reduced gradient magnitude or higher gradients with relatively longer rise times. Finally, there exists a need for a gradient coil permitting use of an inexpensive, lower voltage rating power supply.

SUMMARY OF THE INVENTION

In a first principal aspect, the present invention is a magnetic field gradient coil, assembly, and system for use in imaging techniques requiring a magnetic field gradient. The magnetic field gradient coil includes a plurality of conductors wherein each conductor is arranged in a substantially spatially parallel relationship with respect to the other conductors for generating a magnetic field gradient for imaging. The plurality of substantially spatially parallel conductors may be integrated in a flexible structure. The flexible structure may be ribbon cable.

In the first aspect of the present invention, the magnetic field gradient coil may further include a plurality of layers of the substantially spatially parallel conductors wherein each layer substantially overlies the preceding layer. A selected number of the substantially spatially parallel conductors may be electrically connected in parallel thereby providing a desired switching speed, and/or a desired field gradient strength, and/or a desired match of the output impedance of an electrical power source.

In another principal aspect, the present invention is a magnetic field gradient coil assembly for use in imaging techniques requiring a magnetic field gradient, including a plurality of substantially spatially parallel conductors formed in a plurality of layers wherein each layer substantially overlies the preceding layer. The gradient coil assembly further includes switching means coupled to the plurality of conductors for electrically connecting a selected number of the plurality of conductors in parallel. The switching means may include a plurality of transistors wherein each transistor is coupled to at least one of the conductors to responsively connect the selected number of the conductors in parallel.

In yet another principal aspect, the present invention is a magnetic field gradient coil assembly for use in imaging techniques requiring a magnetic field gradient, including a magnetic field gradient coil having M number of conductors wherein each conductor is arranged in a substantially spatially parallel relationship with respect to the other conductors. The gradient coil assembly further includes switching means, coupled to the magnetic field gradient coil, for electrically coupling an N number of conductors in parallel. The switching means may include a plurality of transistors wherein each transistor is coupled to at least one of the conductors.

The magnetic field gradient coil assembly according to this aspect of the present invention includes a plurality of layers of the substantially parallel conductors wherein each layer substantially overlies the preceding layer.

In still yet another principal aspect, the present invention is a magnetic field gradient coil assembly for use in imaging techniques requiring a magnetic field gradient. The magnetic field gradient coil assembly includes a first gradient coil having a plurality of conductors wherein each conductor is substantially spatially parallel in relation to the other conductors of the first gradient coil; and a first switching means, coupled to the first gradient coil, for electrically coupling an N number of conductors in parallel. The magnetic field gradient coil assembly further includes a second gradient coil having a plurality of conductors wherein each conductor is substantially spatially parallel in relation to the other conductors of the second gradient coil; and a second switching means, coupled to the second gradient coil, for electrically coupling a P number of conductors in parallel. The magnetic field gradient coil assembly also includes a third gradient coil having a plurality of conductors wherein each conductor is substantially spatially parallel in relation to the other conductors of the third gradient coil; and third switching means, coupled to the third gradient coil, for electrically coupling a Q number of conductors in parallel.

The plurality of conductors of each of the first gradient coil, second gradient coil, and third gradient coil according to this aspect of the present invention are conductors of a ribbon cable. Further, the first gradient coil, second gradient coil and the third gradient coil according to this aspect of the invention each include a plurality of layers of the substantially parallel conductors wherein each layer substantially overlies the preceding layer.

In still yet another principal aspect, the present invention is a magnetic field gradient coil including a plurality of windings of ribbon cable having a plurality of conductors wherein each conductor is spatially parallel in relation to the other conductors. The magnetic field gradient coil may include a plurality of layers of the ribbon cable wherein each layer overlies the preceding layer. The magnetic field gradient coil may further include switching means coupled to the plurality of conductors for electrically coupling an M number of conductors in parallel in response to a control signal.

A magnetic field gradient coil constructed using a plurality of conductors wherein each conductor is spatially parallel in relation to the other conductors may be configured to be "driven" in series and/or parallel, or an intermediate or combination thereof.

BRIEF DESCRIPTION OF THE DRAWINGS

In the course of the detailed description of preferred embodiments to follow, reference will be made to the attached drawings, in which:

FIG. 2 illustrates a magnetic field gradient coil assembly having a plurality of coil assemblies or sections each having a construction according to the present invention;

DESCRIPTION OF THE PREFERRED EMBODIMENTS

The present invention is a magnetic field gradient coil and assembly for use in an imaging system which employ or utilize magnetic field gradients, for example, nuclear magnetic resonance imaging and electron spin resonance imaging. The present invention employs a plurality of spatially parallel conductors to design and fabricate magnetic field gradient coils exhibiting rapid switching speeds and relatively uniform magnetic field gradients. The conductors of the magnetic field gradient coil are arranged in a spatially parallel relationship with respect to the other conductors. The plurality of conductors, together, generate the magnetic field gradient required for imaging, for example, nuclear magnetic resonance imaging and electron spin resonance imaging. In a preferred embodiment, these coils are fabricated from ribbon cable consisting of a plurality of spatially parallel solid copper conductors.

The spatially parallel conductors may be layered wherein each layer substantially overlies the preceding layer. That is, each layer of the plurality of substantially parallel conductors overlies the preceding layer so the conductors of that layer overly, and are vertically aligned with, or stacked upon, the conductors of the preceding layer.

Gradient coils fabricated according to the present invention, when implemented with a mode switching apparatus, permit a user to remotely and electronically manipulate the magnetic coil apparatus between series and/or parallel modes, and intermediate modes thereof. Each mode presents a desired set of electrical characteristics, for example, rapid rise times with reduced gradient magnitude or higher gradients with relatively longer rise times.

The advantages of the flexibility in modes of operation are obvious. A magnetic field gradient coil and magnetic field gradient coil assembly fabricated according to the present invention is more readily tailored to a particular application. For example, by recycling the current sequentially through adjacent parallel conductors, series mode operation analogous to the more conventional gradient designs is achieved. Alternatively, driving each conductor of the plurality of spatially parallel conductors of the magnetic field gradient coil in parallel reduces the overall impedance of the coil. The reduction in overall impedance of the gradient coil results in a shorter switching time (of as much as several orders of magnitude over that of conventional gradient coils) as compared to conventional gradient coils. As a result, operating the gradient coil in a parallel mode provides the capability of implementing imaging techniques which require rapidly switched magnetic field gradients.

The present invention is described below with reference to a nuclear magnetic resonance imaging system. It will be appreciated by those skilled in the art that the invention may be implemented in any imaging system using magnetic field gradients, for example, electron spin resonance imaging.

Figure 1:
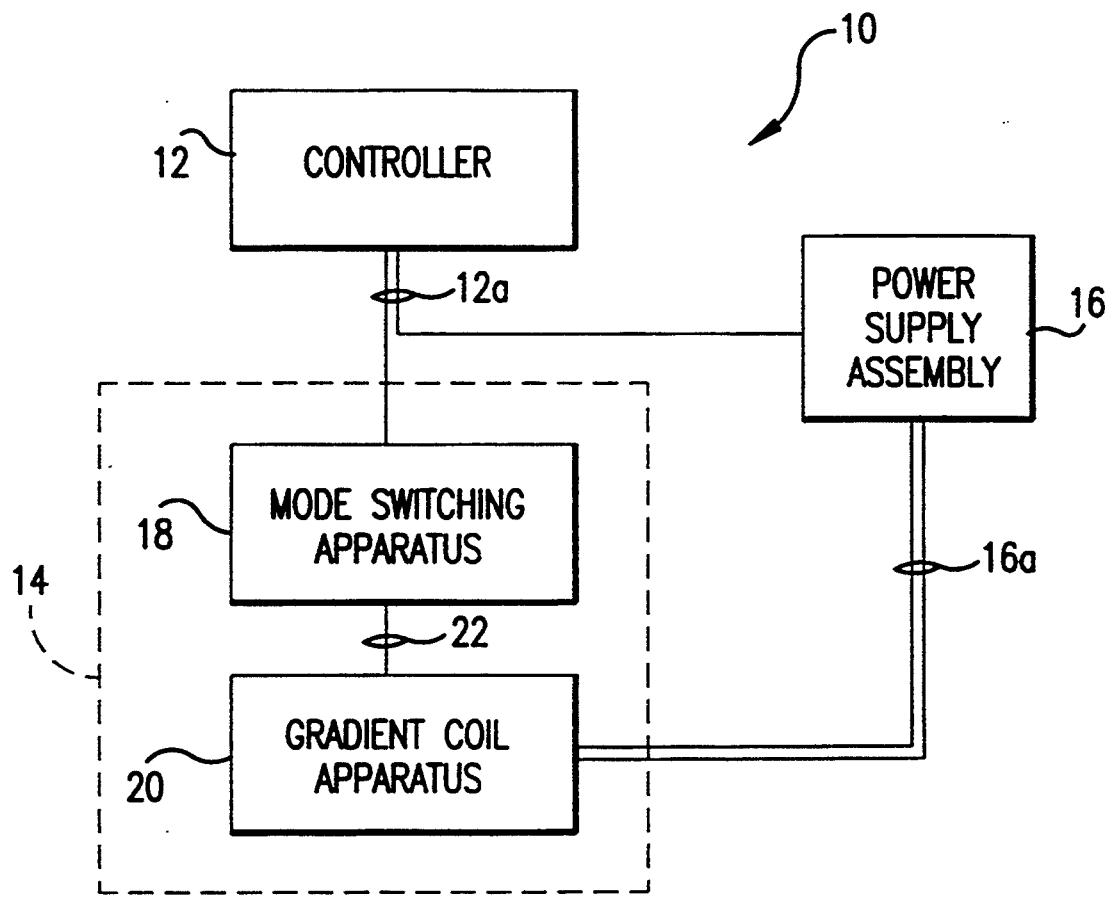
FIG. 1 is a schematic block diagram representation of a nuclear magnetic resonance imaging system according to the present invention.

With reference to FIG. 1, the magnetic field gradient section of the nuclear magnetic resonance imaging system 10 according to the present invention includes a controller 12, a magnetic field gradient coil assembly 14, and a power supply apparatus 16. The imaging system 10 employs the controller 12 as an interface between the user and the various elements of system 10. The user controls all aspects of the system 10 through the controller 12. The controller 12 is electrically coupled to the magnetic field gradient coil assembly 14 and the power supply apparatus 16 through multi-wire bus 12a.

The power supply assembly 16 provides the necessary current and voltage to the coil assembly 14 which is then utilized in the imaging process. That is, the power supply 16 "drives" the coil assembly 14. It should be noted that a gradient coil assembly 14 of the present invention permits the system 10 to employ less expensive, lower voltage power supplies when compared to traditional gradient coils systems. The power supply assembly 16 is electrically coupled to the coil assembly 14 through multi-wire cable 16a.

The voltage and current ratings of the power supply assembly 16 are selected to provide the necessary power for the particular application of the imaging system 10. In a preferred embodiment, the power supply assembly 16 may be three Techron 7570 controlled-current power supplies. The Techron 7570 power supplies may be modified to allow for adjustment of the compensating feedback network by the user via front panel controls. This allows for more optimal matching of the power supply impedance to the load, i.e., maximum stability, and provides more optimum rise times and settling times for the coil assembly 14 regardless of the winding design.

With continued reference to FIG. 1, the magnetic field gradient coil assembly 14 is designed to provide spatial encoding, for example, provide a magnetic field gradient, to the object under study. The magnetic field gradient coil assembly 14 includes a mode switching apparatus 18 and gradient coil apparatus 20. The mode switching apparatus 18 is designed to electronically and remotely facilitate switching the gradient coil apparatus 20 between parallel and series modes, as well as intermediate modes thereof. The mode switching apparatus 18 effectively alters the physical configuration or characteristics of the gradient coil apparatus 20.

When the controller 12 commands the mode switching apparatus 18 into a parallel mode, the mode switching apparatus 18 alters the physical configuration of the gradient coil apparatus 20 to a parallel mode. The mode switching apparatus 18 places the plurality of conductors of the gradient coil apparatus 20 into an electrically parallel state. In this state, the spatially parallel conductors of the gradient coil apparatus 20 are driven in parallel.

In contrast, when the controller 12 commands the mode switching apparatus 18 into the series mode, the mode switching apparatus 18 alters the physical configuration of the gradient coil apparatus 20 to the series mode. Under these circumstances, the mode switching apparatus 18 places the plurality of conductors of the gradient coil apparatus 20 into an electrically series state. In this state, the spatially parallel conductors of the gradient coil apparatus 20 are driven in series. The modes of operation and the mode switching apparatus 18 are discussed in more detail below.

With reference to FIG. 2, the gradient coil apparatus 20 is shown in detail having three coil components, X, Y, and Z. The apparatus 20 of FIG. 2 is one typical configuration for three dimensional imaging. It should be noted that any configuration or geometry of the coil components may be utilized in implementing the present invention. Several configurations and/or geometries are discussed in detail in the following materials: Thomas et al., "Gradient Coil Technology," in *NMR in Medicine: The Instrumentation and Clinical Applications*, Thomas et al., eds., Am. Inst. Physics, New York, 1986, pp. 111-141; Golay, "Homogenizing Coils for NMR Apparatus," U.S. Pat. No. 3,622,869; Romeo et al., "Magnet Field Profiling: Analysis and Correcting Coil Design," *Magn. Reson. Med.* 1 (1984) 44; Turner, "A target field approach to optimal coil design", *J. Phys. D: Appl. Phys.* 19 (1986) L147; Turner, "Minimum inductance coils", *J. Phys. E: Sci. Instrum.* 21 (1988) 952; Suits et al., "Improving magnetic field gradient coils for NMR imaging", *J. Phys. E: Sci Instrum.* 22 (1989) 565; Mansfield et al., "Multishield Active Magnetic Screening of Coil Structures in NMR", *J. Magn. Resonan.* 72 (1987) 211; and Turner et al., "Passive Screening of Switched Magnetic Field Gradients", *J. Phys. E: Sci. Instrum.* 19 (1986) 876.

Figure 4A:
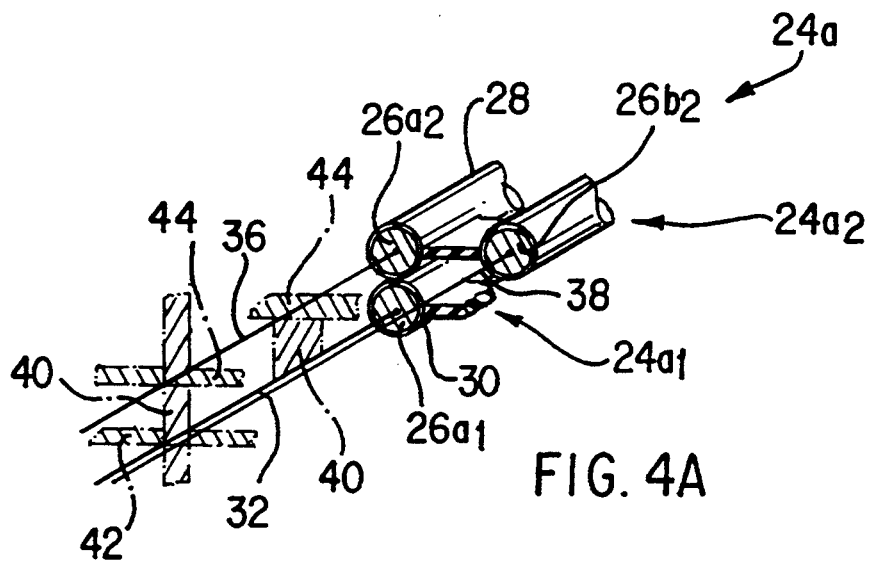
FIG. 4A and 4B are cross-sectional illustrations of the parallel conductors of the magnetic field gradient coil of FIG. 3 depicting their cross-sectional longitudinal axes.
Figure 4B:
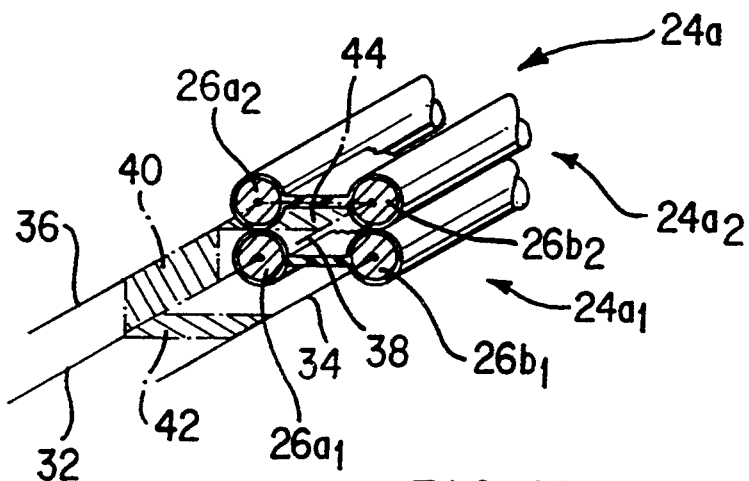
Figure 3:
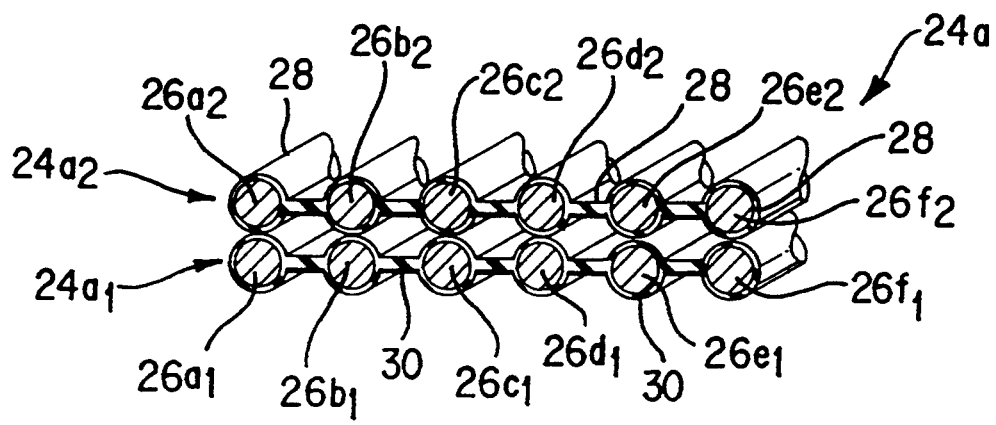
FIG. 3 is a cross-sectional illustration of two layers of a plurality of substantially parallel conductors of the magnetic field gradient coil assembly of the present invention.

With reference to FIGS. 3, 4A and 4B the individual coil sections of the gradient coil 20 are fabricated using a plurality of conductors arranged in a spatially parallel relationship with respect to each other. In the illustrative embodiment, coil section $24a$ includes a first layer $24a_1$ and a second layer $24a_2$. The first layer $24a$, includes a plurality of conductors $26a_1-26f_1$. The conductors $26a_1-26f_1$ are arranged in a spatially parallel relationship. That is, cross-sectional longitudinal axis 32 of conductor $26a_1$ is substantially parallel to cross-sectional longitudinal axis 34 of conductor $26b_1$; and both are substantially parallel to all of the other conductors of the first layer $24a_1$.

Similarly, the second layer $24a_2$ includes a plurality of conductors and $26a_2-26f_2$. The conductors $26a_2-26f_2$ are arranged in a spatially parallel relationship which is similar to the conductors $26a_1-26f_1$. The cross-sectional longitudinal axis 36 of conductor $26a_2$ is substantially parallel to the cross-sectional longitudinal axis 38 of conductor $26b_2$ which are both substantially parallel to all of the other conductors of the second layer $24a_2$.

The conductors $26a_1-26f_1$ and $26a_2-26f_2$ may be secured or retained in a substantially fixed spatial relationship with respect to each other by way of a casing 28 and 30, respectively. The casings 28 and 30 may also be fabricated from an insulative type material which insulates the conductors from each other and the environment.

The plurality of conductors of the gradient coil 20 may be wire, for example copper or gold. The conductors may be, for example, flat, square or cylindrical. The gauge of the wire may be selected according to the application and/or the geometric or spatial constraints of the gradient coil 20. In those instances where the gradient coil 20 is to perform imaging of small objects, large gauge wire may be advantageously employed. Alternatively, relatively smaller gauge wire may be employed in the fabrication of the gradient coil in other instances. Moreover, the type of the conductor may be solid or stranded (braided).

In one preferred embodiment, the parallel conductors of the coil section 24a are conductors of a ribbon cable, for example 3M model 2651 ribbon cable. The 2651 ribbon cable has 26 gauge solid copper conductors. The conductors of the ribbon cable are secured or spatially fixed with respect to each other by plastic ribbon cable insulation.

It should be noted that when the coil sections 24a-c (the X, Y, and Z components, respectively) are fabricated from ribbon cable, the wide, flat profile of the ribbon cable makes it is easier to handle than discrete wires. The plastic insulation of the ribbon cable enables the ribbon cable to be more easily secured to a plexiglass type former.

With continued reference to FIGS. 3, 4A and 4B in one preferred embodiment, the spatially parallel conductors of coil section 24a are layered wherein each layer substantially overlies the preceding layer and the longitudinal axes of the conductors $26a_1$-$f_1$ and $6a_2$-$f_2$ are substantially parallel. That is, the longitudinal axis 32 of conductor $26a_1$ is parallel to the longitudinal axis 36 of conductor $26a_2$; the longitudinal axis 32 of conductor $26a_1$ is parallel to the longitudinal axis 36 of conductor $26a_2$; and so on.

In the illustrative and one preferred embodiment, the longitudinal axis of the conductors $26a_1$-$26f_1$ define a geometric plane 42; and the longitudinal axis of the conductors $26a_2$-$26f_2$ define a geometric plane 44. In this preferred embodiment, each layer of the plurality of substantially parallel conductors overlies the preceding layer so the conductors of that layer overly, and are substantially aligned with, the conductors of the preceding layer. In this illustrative embodiment, the geometric plane 40 formed by the longitudinal axes 32 and 36 of conductors $26a_1$ and $26a_2$, respectively, is perpendicular to the geometric planes 42 and 44 formed by longitudinal axes of each conductor of the first and second layers, $24a_1$ and $24a_2$.

Although not necessary, each coil section 24a, 24b and 24c (X, Y, and Z coil components, respectively) of the gradient coil apparatus 20 may be fabricated with a different number of spatially parallel conductors. For example, the coil section 24a may be fabricated with 8 spatially parallel conductors; the coil section 24b may be fabricated with 9 spatially parallel conductors; and the coil section 24c may be fabricated with 10 spatially parallel conductors. The different shapes of the coil components 24a, 24b, and 24c may be one reason for having different numbers of conductors in each coil section. Moreover, when the conductors are part of a ribbon cable, the number of conductors used in the coil components is determined somewhat by the value of cable width required to provide the necessary coil shape factor.

With reference to FIGS. 2 and 3, in one illustrative embodiment, the X component saddle coil 24a ($dB_z/dx$) was wound closest to the coil-former and had the smallest effective coil radius. The Z component Maxwell coil 24c ($dB_z/dz$) was wrapped last and had the largest effective radius. In this manner, coils with larger effective radii correspond to a larger shape factor and hence a wider ribbon cable. A benefit of the increased number of conductors for coils of larger radii is that the number of ampere-turns is increased to help compensate for the loss in field magnitude (Field gradient strength is proportional to $1/r^2$).

Magnetic field gradient coils may be designed and fabricated having only one layer. When fabricating coil sections having multiple layers, however, attention should be given to maintaining good winding uniformity. Winding uniformity may be more easily maintained using ribbon cable having a plurality of spatially parallel conductors.

With reference to FIGS. 2 and 3, in one illustrative example, a total current of 17.5 Amperes was passed through each of the coil sections 24a-c (i.e., the X, Y, and Z coil sections). The coil (approximately 10 centimeters in diameter) sections were fabricated from ribbon cable having 26 gauge solid copper conductors. The X coil section 24a was constructed using 5 turns of a ribbon cable with 8 conductors. The Y coil section 24b had 5 turns of cable with 9 conductors. The Z coil section 24c had 5 turns of cable with 10 conductors. A maximum value of the magnetic field gradient of $G_k$=2.8, 2.4, 2.2 G/cm for each of the X, Y, Z gradient coils of the parallel mode coil, respectively, may be anticipated.

When fabricating a multiple layer magnetic field gradient coil, the different layers may be formed by "folding" or "wrapping" a single piece of ribbon cable to form and shape the coil. Alternatively, discrete pieces of ribbon cable may be layered to form and shape the coil. In particular, with reference to FIG. 3, when the coil section 24a is formed and shaped from a single piece of ribbon cable, the conductors of the first layer $24a_1$ are physically the same conductors of the second layer $24a_2$. Under this circumstance, the second layer $24a_2$ overlies the first layer $24a_1$ when the first layer $24a_1$ is "folded" to form the coil section 24a.

Alternatively, the coil section 24a may be formed and shaped from a plurality of separate pieces of ribbon cable which are layered in a fashion as described above. Under this circumstance the conductors of the first layer $24a_1$ are separate conductors from those of the second layer $24a_2$ and each layer of the coil section 24a may be driven separately and simultaneously by the power supply apparatus 16.

Figure 5:
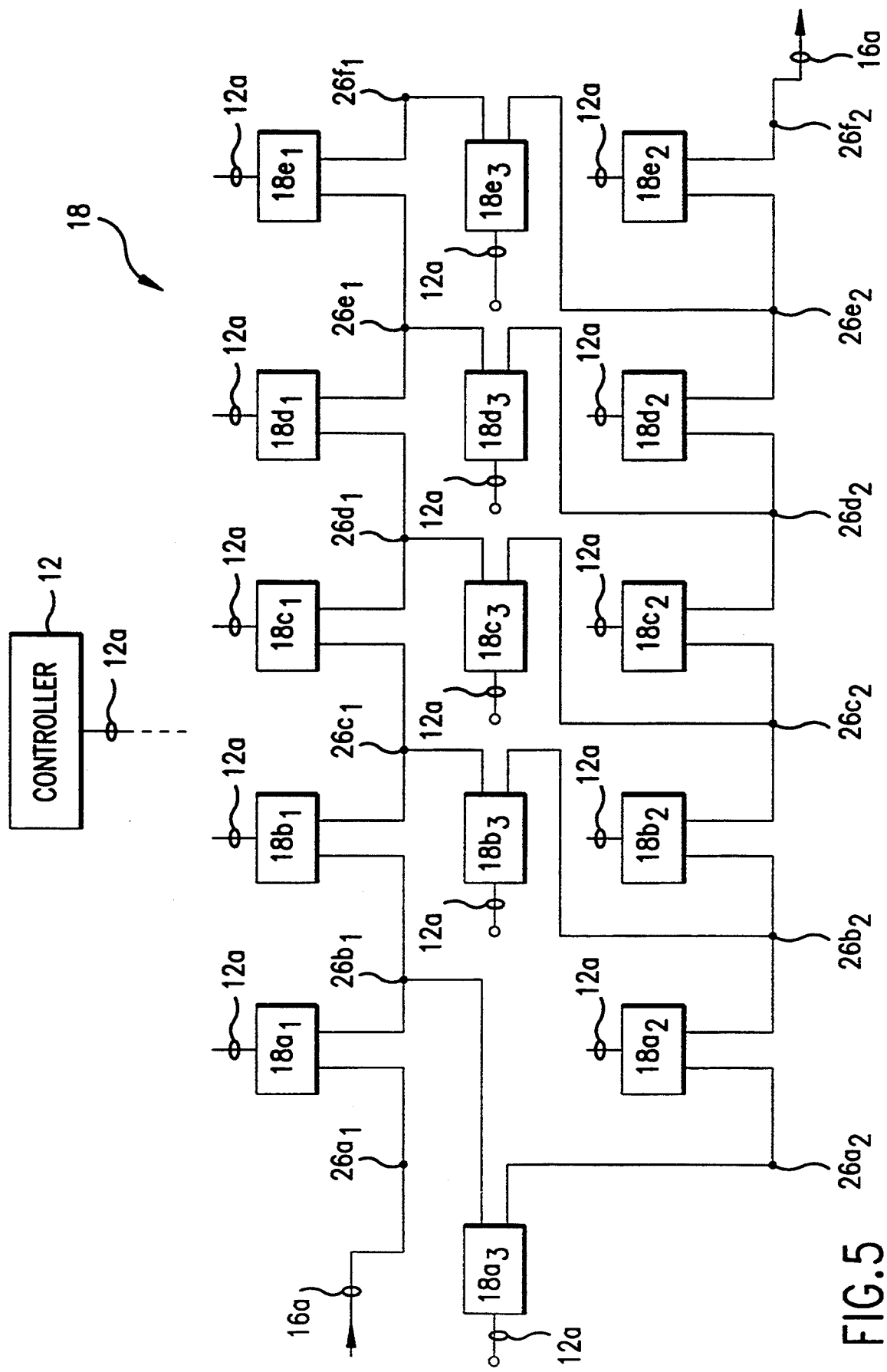
FIG. 5 is a detailed schematic block diagram representation of the magnetic gradient coil assembly including the mode switching apparatus of the nuclear magnetic resonance imaging system of FIG. 1.

With reference to FIG. 5, the mode switching apparatus 18 is illustrated and described below with reference to the conductors 26a-f of the coil section 24a. The mode switching apparatus 18, and its function, is described below in conjunction with the coil section 24a consisting of a single layer having conductors 26a-f. The conductors 26a-f have a first end $26a_1$-$26f_1$, respectively, and a second end $26a_2$-$26f_2$, respectively. In the illustrative embodiment, the conductor $26a_1$ is coupled to the input current line from the power supply apparatus 16; and conductor $26f_2$ is coupled to the current return line to the power supply apparatus 16.

The mode switching apparatus 18, as mentioned above, is designed to remotely and electrically alter the physical and electrical characteristics of the coil sections 24a–c to suit a particular application of the nuclear magnetic resonance imaging system 10. In the illustrative embodiment, the mode switching apparatus 18 includes mode switching elements $18a_1$–$18a_3$, $18b_1$–$18b_3$, $18c_1$–$18c_1$, $18d_1$–$18d_3$, and $18e_1$–$18e_3$. In this embodiment, the number of mode switching elements necessary is $3(N-1)$ where N is the number of substantially parallel conductors that are capable of being switched between modes (for example, the number of conductors in the ribbon cable). The mode switching elements $18a_1$ and $18a_2$, $8b_1$ and $18b_2$, $18c_1$ and $18c_2$, $18d_1$ and $18d_2$, and $18e_1$ and $18e_2$ are employed to couple selected conductors in parallel. The mode switching elements $18a_3$, $18b_3$, $18c_3$, $18d_3$, and $18e_3$ are employed to couple selected conductors in series.

For the purposes of conceptualizing, the mode switching elements $18a_1$–$18a_3$, $18b_1$–$18b_3$, $18c_1$–$18c_3$, $18d_1$–$18d_3$, and $18e_1$–$18e_3$ may each be functionally envisioned as single pole single throw electrical switch. The controller 12 is coupled to the mode switching elements $18a_1$–$18a_3$, $18b_1$–$18b_3$, $18c_1$–$18c_3$, $18d_1$–$18d_3$, and $18e_1$–$18e_3$ via multi-bus 12a.

In operation, the user, via controller 12, commands the individual conductors 26a–f into a parallel mode or a series mode, or an intermediate thereof. In response to a parallel mode command, the mode switching apparatus 18 selectively and electrically interconnects the selected conductors at each first end $26a_1$–$f_1$ and at each second end $26a_2$–$f_2$; and the mode switching apparatus 18 disconnects the series connection. For example, if the user selects the conductors 26a and 26b to be driven in parallel, then the mode switching element $18a_1$ interconnects conductors 26a and 26b at their first ends $26a_1$ and $26b_1$, respectively; and the mode switching element $18a_2$ interconnects the conductors 26a and 26b at their second ends $26a_2$ and $26b_2$, respectively. The mode switching element $18a_3$ disconnects the series connection between conductor 26a at the second end $26a_2$ and conductor 26b at the first end $26b_1$. Driving the selected conductors of the spatially parallel conductors of the magnetic field gradient coil in parallel reduces the overall impedance of the coil. As mentioned above, the reduction in overall impedance of the gradient coil results in a shorter switching time compared to a series mode. As a result, operating the gradient coil in the parallel mode provides the capability of implementing imaging techniques which require rapidly switched magnetic field gradients.

In response to a series mode command, the mode switching apparatus 18 selectively and electrically disconnects the selected conductors at each first end $26a_1$–$f_1$ and disconnects the selected conductors at each second end $26a_2f_2$; and selectively and electrically interconnects the series connection. For example, if the user selects the conductors 26c and 26d to be driven in series, then the mode switching element $18c_1$ disconnects conductors 26c and 26d at their first ends $26c_1$ and $26d_1$, respectively; and the mode switching element $18c_2$ disconnects the conductors 26c and 26d at their second ends $26c_2$ and $26d_2$, respectively. The mode switching element $18c_3$ interconnects the conductor 26c at the second end $26c_2$ and conductor 26d at the first end $26d_1$. As a result, the current is sequentially "recycled" through adjacent parallel conductors. The series mode operation is somewhat analogous to the more conventional gradient designs.

In a preferred embodiment, the mode switching elements $18a_1$–$18a_3$, $18b_1$–$18b_3$, $18c_1$–$18c_3$, $18d_1$–$18d_3$, and $18e_1$–$18e_3$ are implemented using Metal Oxide Semiconductor Field Effect Transistors (MOSFETs). The user may select the number of conductors to be driven in parallel using MOSFETs at the input and output of each coil section 24a–c. MOSFETs capable of dissipation of hundreds of watts of power at voltages well in excess of 100 V are commercially available. In a preferred embodiment, the mode switching elements 18a–c are implemented using N-Channel Enhancement-Mode Silicon Gate TMOS devices manufactured by Motorola, for example, Model No. MTM15N35. The data sheets for the Motorola family of TMOS Power MOSFETs are hereby incorporated by reference. TMOS Power MOSFETs devices are advertised as having the following specifications: 15 $A_{max}$; 350 $V_{max}$; and 250 $W_{max}$.

In the operation of this preferred embodiment, the desired number of conductors to be driven in parallel may be electronically selected by the application of a proper voltage bias to the gates of the transistors used in implementing the mode switching apparatus 18. The proper voltage bias may be applied by the controller 12 as a mode command. The voltage bias of the transistors may be controlled through software written into the data acquisition sequence, directed from a host computer in the controller 12. This permits the user to customize the gradient coil apparatus 20 to a particular application.

The number and placement of the switching elements 18a–c for multi-mode operation may depend upon, for example, the geometry of the coil sections 24a–c and/or the gradient coil apparatus 20. In addition, the placement of the individual mode switching elements 18a–c may depend somewhat upon the way in which the individual coil sections are connected.

The number of switching elements of the mode switching apparatus 18 may also depend upon the flexibility desired in the gradient coil apparatus 20. For example, although FIG. 5 illustrates a general configuration, a switching element configuration coupling two, three, four, etc. conductors may be implemented. Under these circumstances, for example, the number of switching elements may be increased or decreased to suit a particular application or configuration. Numerous configurations may be devised and implemented.

It should be noted, however, that the configuration of the mode switching apparatus 18 in relation to the conductors 26a–f is illustrative. Other configurations may reduce the number of mode switching elements necessary to perform the assigned task.

Further, with continued reference to FIG. 5, all of the conductors of a coil section need not be coupled to a switching element. Instead, any number of conductors may be "permanently connected" in a configuration, for example, to an adjacent conductor. As a result, these conductor would be "permanently" configured in a parallel mode and may not be switched or configured in a series mode.

For the purposes of clarity and conciseness, it should be noted that the mode switching apparatus 18 may also be implemented with the coil sections 24b and 24c in the same fashion as described above. Not all of the coil sections, however, need employ the functionality of the mode switching apparatus 18. Under this circumstance, the coil section is configured in a parallel mode and/or a series mode, or combination thereof, during manufacture.

Importantly, the advantages of the plurality of spatially parallel conductors including the short winding or coil fabrication time, ease of construction, and easily achieved winding uniformity are obtained regardless of the mode (i.e., parallel, series, or multi-mode) of coil operation. That is, a gradient coil apparatus 20 acquires these advantages notwithstanding the mode switching apparatus 18.

TECHNICAL BACKGROUND

Briefly, by way of background, the value of magnetic field gradient ($G_k$) produced by a magnetic field gradient coil is proportional to the product "$N \times i$" where "N" is the number of turns of conductor used in fabricating the gradient coil and "i" is the current passing through the coil. A higher magnetic field gradient may be obtained by increasing the current which flows through the coil and/or by increasing the number of turns used in constructing the coil.

The ampere-turn product may not be increased without limit. The maximum value of current, $i_{max}$, that may be safely passed through the gradient coil is determined by the power dissipation capability of the coil. Power is dissipated as heat in the coil, with a magnitude proportional to the absolute value of $i^2$. As a result, when determining $i_{max}$, both the duration and duty cycle of the current waveform as well as the size of the conductor used in construction of the coil and the mechanism of heat removal from the coil must be considered. A limitation to the current is the maximum current, $i_g$, available from the power supply. With the current fixed by such constraints, an increase in $G_k$ may be achieved by increasing "N", the number of turns of the conductor used in fabricating the gradient coil. Most gradient coils have $N >> 1$. Therefore, a lower value of current (to protect both the coil and the sample from damage due to overheating) must be compensated by a larger number of turns to provide the required magnetic field gradient.

The impedance ($Z_c$) of the coil increases with N, and may be excessively large when $N >> 1$. The impedance of the coil is an important parameter or characteristic of the gradient coil. In addition to directly establishing the value of $i_g$, the impedance of the coil is related to the time it takes for the gradient coil to be switched, i.e., the time ($t_0$) required for the current to rise from $i_1$ to $i_2$ and the time required for the current to fall from $i_2$ to $i_1$. The rise time of the current is the transition time required to establish the magnetic field gradient. In general, a coil of lower impedance may be switched more rapidly than a coil of higher impedance. Considering that both the signal-to-noise ratio and the image resolution in a nuclear magnetic resonance imaging application are time dependent, gradient coils with a smaller impedance appear to be better suited. There is then a tradeoff in speed versus strength, and typically a sacrifice in speed must be made in order to achieve a higher value of magnetic field gradient.

Thus, it may be seen that the relatively large impedance of conventional nuclear magnetic resonance imaging coils poses a performance limitation to the switching times of the coils, i.e., the rise time of the current pulse which establishes the magnetic field gradient and the fall time of the current pulse which cancels the magnetic field gradient. Very large, high voltage power supplies are often employed to provide shorter current rise time. Often, when rapid switching of the gradient coils is imperative, power supplies are cascaded to provide an adequate voltage value and large time rate of change of current, $di/dt$. Using a single, less expensive, low voltage power supply, typical current rise times range from hundreds of microseconds for smaller gradient coils to a few milliseconds for large gradient coils.

For applications requiring rapidly switched magnetic field gradients, the optimal gradient coil may be one with a minimum impedance. However, applications requiring a high value of magnetic field gradient demand a coil with a high ampere-turn product. As the power dissipated in the coil due to the current flowing through the coil increases as the absolute value of $i^2$, high strength magnetic field gradient coils typically have a large number of turns and a large impedance. Therefore, the performance criteria of the coil must be specified, and together with the performance specifications of the power supply must be considered to determine the value of "N" for the coil.

As mentioned above, most gradient coil designs employ a single conductor (wire) to provide the path for current flow. The present invention of magnetic field gradient coil fabrication utilizes a plurality of conductors arranged in a spatially parallel relationship with respect to each other, for example a ribbon cable having M number of spatially parallel conductors or wires. Each section of the gradient coil assembly may be fabricated in such a fashion. As a result, the same coil may be constructed both for applications requiring high values of $G_k$ and for applications requiring faster switching speeds. The coil assembly may be tailored to the particular application by electrically connecting the individual conductors in a series and/or parallel configuration, or a combination thereof.

In those instances where all of the spatially parallel conductors are driven in parallel, with the current distributed equally in each of the conductors, it is well known that parallel inductors yield a total inductance that is given by:

$$1/L_{total} = \text{Summation of } 1/L_i. \quad (1)$$

where $L_i$ are the inductance values of the M number of individual inductors and $i = 1$ to M. Similarly, the net resistance of M parallel resistances is given by:

$$1/R_{total} = \text{Summation of } 1/R_i \quad (2)$$

where $R_i$ are the resistance values of the M number of individual resistors and $i = 1$ to M.

In accordance with the EQUATION (3) immediately below, the overall impedance (L and R) of a gradient coil constructed using a M number of substantially parallel conductors is reduced by a factor of $M^2$ in comparison to conventional gradient coil designs.

$$L_{parallel}/L_{Series} = R_{parallel}/R_{Series} = [(N/M)^2/N^2] = 1/M^2 \quad (3)$$

It should be noted, however, that the current through each of the parallel conductors should be equal to that which flows through the single wire of the conventional design in order to preserve the value of ampere-turns ($[M \times N] \times i$). Therefore, at the expense of a higher overall current requirement placed on the power supply, the coil inductance and resistance are substantially reduced.

In a spatially parallel conductor gradient coil design as illustrated in FIG. 2, the sections of the coil, i.e., the four sections of the saddle coils and the two sections of the Maxwell coils, were driven in series, providing proper current magnitude and phase to ensure gradient uniformity.

The parallel connection of the wires of the ribbon cable provides a shorter switching time by fully utilizing the voltage capabilities of the driving power supply. Although the coil makes maximum utilization of the available power supply voltage, the maximum current available from the power supply will ultimately limit the magnitude of the field gradient achievable with the parallel conductor design.

It should be noted that some nuclear magnetic resonance imaging applications may not require rapid switching speeds, but instead require a higher overall field gradient strength. For such applications, the conductors of the substantially parallel conductors may be connected in a series mode. The particular mode of operation—series or parallel—may be determined by the user subsequent to the construction of the gradient coil.

It should be further noted that the magnetic field gradient coil design is not limited to either series or parallel. The number of conductors driven in parallel may be adjusted by the user to a value n where $1 \leq n \leq M$. By recycling the current sequentially through each adjacent conductor in the assembly, i.e., setting n=1, series mode operation analogous to a more conventional gradient coil design is achieved. This will permit a higher gradient strength at the expense of a reduced switching speed, while continuing to use a low voltage power supply to drive the unit.

Driving the current simultaneously through the individual conductors, i.e., setting n=M, a parallel mode of operation is achieved. The coil load is dependent upon the mode in which the coil is driven. Therefore, operation of the gradient coil in different modes may require the user to "calibrate" the feedback resistance and capacitance of the power supply to provide optimum match to each load so that minor changes in gradient shapes may be avoided.

It should be noted that compensating resistors required in other parallel designs, for example Bowtell et al, are unnecessary in the present invention. Here, the spatially parallel conductors may be wound from, for example, ribbon cable, onto the former as a single cable, maintaining equal lengths for each of the individual conductors. As a result, each conductor has substantially identical electrical characteristics.

In sum, gradient coils designed and fabricated according to the present invention provide the advantages of ease of construction, improved winding uniformity, and better uniformity of the magnetic field gradient. In a parallel mode of operation, the current is driven simultaneously through selected individual conductors. The lower coil impedance provides shorter current and field rise times and also provides a better match to less expensive, lower voltage power supplies. In a series mode, the current is sequentially cycled through selected adjacent conductor in the same coil. For an equal input current from the power supply, the series mode configuration provides a higher gradient strength. The present invention, however, is not limited to either series or parallel modes of operation, but offers the flexibility of operation within these two extremes.

Various preferred embodiments of the present invention have been described. It is understood, however, that changes and modifications may be made without departing from the true scope and spirit of the present invention as defined by the following claims, which are to be interpreted in view of the foregoing. For example, it should be noted that the present invention may be implemented and practiced with numerous other cables and geometries than as illustrated and described herein.

Moreover, the present invention may be implemented and practiced using numerous types of spatially parallel conductor cable. For example, the present invention may be implemented and practiced using commercially available ribbon cable or custom ribbon cable having various structural and electrical characteristics such as, gauges, pitches, insulations. The Cooner Wire Company of 9186 Independence, Chatsworth Calif., for instance, or MWS Wire Industries of 31200 Cedar Valley Drive, Westlake Village, Calif., may provide custom made ribbon cables made with different conductor shapes, sizes, cable pitch and insulation.

In addition, it should be noted that while the present invention has been described for the application of nuclear magnetic resonance imaging, the invention may be implemented in other imaging modalities requiring magnetic field gradients, for example, electron spin resonance imaging.

What is claimed is:

1. A magnetic field gradient coil for use in imaging techniques requiring a magnetic field gradient, said magnetic field gradient coil comprising,
at least one strip having a plurality of N conductors wherein each conductor is arranged in a substantially spatially parallel relationship with respect to the other conductors for generating a magnetic field gradient for imaging; and
switching means for electrically coupling an M number of conductors in parallel in response to a control signal.

2. The magnetic field gradient coil of claim 1 wherein the at least one strip is a flexible structure.

3. The magnetic field gradient coil of claim 2 wherein said flexible structure is ribbon cable.

4. The magnetic field gradient coil of claim 3 wherein said conductors are solid wire.

5. The magnetic field gradient coil of claim 1 further including a plurality of layers of the at least one strip wherein each layer substantially overlies the preceding layer.

6. The magnetic field gradient coil of claim 5 wherein a selected number of the substantially spatially parallel conductors are electrically connected in parallel thereby providing a desired switching speed.

7. The magnetic field gradient coil of claim 5 wherein a selected number of the substantially spatially parallel conductors are electrically connected in parallel thereby providing a desired field gradient strength.

8. The magnetic field gradient coil of claim 5 wherein a selected number of the substantially spatially parallel conductors are electrically connected in parallel thereby providing a desired match of the output impedance of an electrical power source.

9. A magnetic field gradient coil comprising,
a plurality of windings of strip having a plurality of n conductors wherein each conductor is substantially spatially parallel in relation to the other conductors; and
switching means for electrically coupling an m number of conductors in parallel in response to a control signal.

10. The magnetic field gradient coil of claim 9 wherein the strip is a flexible structure.

11. The magnetic field gradient coil of claim 10 wherein said strip is ribbon cable.

12. The magnetic field gradient coil of claim 11 further including a plurality of layers of said ribbon cable wherein each layer substantially overlies the preceding layer.

13. The magnetic field gradient coil of claim 12 wherein said switching means includes at least one semiconductor switch which is coupled to at least two of the N number of conductors.

14. The magnetic field gradient coil of claim 13 wherein said semiconductor switch is a transistor.

15. The magnetic field gradient coil of claim 12 wherein said plurality of conductors are solid wire.

16. The magnetic field gradient coil of claim 10 wherein said switching means includes a plurality of transistors wherein at least one transistor is coupled to at least one of said M number of conductors.

17. A magnetic field gradient coil for use in imaging techniques requiring a magnetic field gradient, said magnetic field gradient coil comprising,
- a plurality of flexible strips each including a plurality of N conductors wherein each conductor is arranged in a substantially spatially parallel relationship with respect to the other conductors; and
- switching means for electrically coupling an M number of conductors in parallel in response to a control signal.

18. The magnetic field gradient coil of claim 17 wherein the plurality of flexible strips substantially overly each other.

19. The magnetic field gradient coil of claim 17 wherein the flexible strip is ribbon cable.

20. The magnetic field gradient coil of claim 17 wherein said conductors are solid wire.

21. The magnetic field gradient coil of claim 17 wherein said switching means includes at least one semiconductor switch which is coupled to at least two of said N number of conductors.

* * * * *